United States Patent [19]

Bodahl-Johnsen

[11] Patent Number: 5,541,802

[45] Date of Patent: Jul. 30, 1996

[54] MAGAZINE ARRANGEMENT INCLUDING REMOVABLE CIRCUIT BOARDS

[75] Inventor: Helge Bodahl-Johnsen, Huddinge, Sweden

[73] Assignee: Telefonaktoebolaget L M Ericsson, Stockholm, Sweden

[21] Appl. No.: 321,175

[22] Filed: Oct. 11, 1994

[30] Foreign Application Priority Data

Oct. 12, 1993 [SE] Sweden ................... 93 03342

[51] Int. Cl.$^6$ .............. H01R 23/68; H02H 3/20
[52] U.S. Cl. ................ 361/91; 361/788; 361/824
[58] Field of Search ................ 361/788, 790, 361/792, 793, 794, 802, 824, 791, 91, 816; 439/923, 924.1, 924.2

[56] References Cited

U.S. PATENT DOCUMENTS

| | | | |
|---|---|---|---|
| 4,079,440 | 3/1978 | Ohnuma et al. | 361/816 |
| 4,574,332 | 3/1986 | Calabro | 361/791 |
| 5,092,799 | 3/1992 | Kimura | 439/924 |

Primary Examiner—Jeffrey A. Gaffin
Assistant Examiner—Michael J. Sherry
Attorney, Agent, or Firm—Burns, Doane, Swecker & Mathis, L.L.P.

[57] ABSTRACT

The invention relates to a magazine arrangement for enabling one or more printed circuit boards to be held in the magazine but readily removable therefrom, wherein the circuit boards are disposed side-by-side and can be inserted into and withdrawn from the magazine by virtue of each board having upper and lower edge-parts which coact with upper and lower grooves in the magazine. Each board carries on its edge that faces inwardly of the magazine one part of a connecting element which is intended to be brought into and out of coaction with a second part of the connecting element, this latter part being located on the backplane of the magazine. The two parts of the connecting element are each provided with a corresponding connecting device, wherein devices are provided for damping transient voltages that occur within board-mounted and/or board-connected electrical and/or electronic components, among other things, when a normalized voltage is applied to said components. The devices include at least one current-supply rail or contact strip which is to be received in a magazine-mounted groove or channel for voltage application. At least one board is provided adjacent an edge-part thereof that coacts with the groove or channel with a contact strip-part which can coact with the rail and through which a voltage is applied directly to the board-mounted electric and/or electronic components. When viewed in the direction in which a board is inserted into the magazine, the contact strip-part is preceded by a further contact strip-part coacting with the rail or the coact strip, wherein the two contact strip-parts are connected electrically by circuit-board related connection, enabling the board to be supplied with a voltage to dampen transient voltages that occur within the components.

16 Claims, 1 Drawing Sheet

MAGAZINE ARRANGEMENT INCLUDING REMOVABLE CIRCUIT BOARDS

TECHNICAL FIELD

The present invention relates to a magazine arrangement and then particularly, but not exclusively, to a magazine of the kind which is constructed to allow a plurality of circuit boards normally disposed in side-by-side relationship to be held firmly in the magazine by virtue of coaction of the top and the bottom edge-parts of respective circuit boards with particularly configured top and bottom grooves or channels in the magazine, wherein each circuit board carries at the edge thereof that faces in towards the magazine interior a first part of a two-part connecting element which is intended to engage with and disengage from a second, corresponding part of the connecting element positioned on one plane of the magazine, such as a backplane.

In the case of a magazine of this kind, each of the two connecting-element parts is provided with a respective corresponding connecting device, wherein these connecting devices can be brought to and from mutually coacting positions by movement in a corresponding direction.

The present invention also relates to the use of means which function to dampen transient voltages that occur within electrical and/or electronic components mounted on and/or connected to the circuit board on the instance of applying a voltage to said components through a normalized supply voltage.

DESCRIPTION OF THE PRIOR ART

It is known within different technical fields that occurrent transient voltages, overcurrents and the like can be dampened by applying a normalized supply voltage momentarily to electrical and/or electronic components.

For instance, it is known to utilize spark gaps or electronic components with associated circuits to block or dampen transient voltages which exceed a normalized supply voltage.

It is also known to use with supply circuits a starting resistance to momentarily limit the current values to within predetermined limits when starting up direct-current motors.

With regard to devices and arrangements of the aforesaid kind adapted for a magazine of the aforesaid kind, it is known to apply different measures and to use different means to dampen the transient voltages that occur when applying a normalized supply voltage, since it is known that when a circuit board is inserted into a magazine, the leading or initial edge of the supply voltage is liable to generate transients which have a disturbing influence on sensitive elements and components.

It is also known that the insertion of a circuit board into a magazine can cause permanent damage to equipment and/or electrical and/or electronic elements mounted on the board.

It is also known that when a circuit board carrying a static charge is inserted into a magazine, the board may be discharged or drained upon electrical contact with the connecting devices of the connecting element or with backplane contacts, therewith inducing disturbances in the system.

It has been found that a strong initial current or voltage edge or flank is generated when a normalized d.c. voltage is suddenly applied to the board, and when the board includes one or more charge-adapted capacitors and the like.

Consequently, it has been endeavored to provide magazines of the aforesaid kind which includes means for minimizing and/or at least overcoming these problems, for instance by giving some or all of the voltage-connection connecting devices, such as pin connectors, a longer length, or by making corresponding contact devices, such as socket contacts, longer, so that these components will come into electrical contact with current and voltage supplying backplane-carried contacts before the signal contact devices come into contact with corresponding signal contact devices.

It has also been proposed to provide the backplane with large capacitors which deal with the voltage transients that occur when voltage is applied.

The teachings of the following U.S. prior publications also form part of the known prior art.

For instance, U.S. Pat. No. 4,079,440 teaches an electric contact union between a printed circuit board and a magazine backplane, wherein the magazine is able to accommodate a plurality of such boards.

The object of this invention is to connect the pin connectors in an ordered sequence and not all at the same time.

The publication also describes in particular the use of different pin connectors of different lengths. The publication teaches the possibility of first connecting earth potential and supply voltage and then achieve full electrical connection of the magazine signal contacts with corresponding signal pin-contacts on the circuit board, with the aid of pin connectors of mutually different lengths.

The publication also mentions the use of the same principle construction to enable the supply voltage to be connected in two stages.

Earth potential and a lower supply voltage are connected first, followed by the application of a normalized supply voltage, whereafter the signal-transmitting contact device is connected last when inserting the circuit board, this procedure being the reversed when withdrawing the board. U.S. Pat. No. 5,092,799 also describes and illustrates an arrangement which, similar to U.S. Pat. No. 4,079,440, includes longer pin connectors for initial connection to earth potential and a selected supply voltage, followed by connection to the signal contacts. U.S. Pat. No. 4,574,332 teaches a construction in which the supply voltage and earth potential are related to circuit-board guide rails, although it will be noticed that a normalized supply voltage is cut-in or applied in one single stage.

DISCLOSE OF THE INVENTION

TECHNICAL PROBLEMS

When studying the known prior art as described above and also when considering a magazine arrangement of the aforedefined kind, it will be seen that a technical problem in this particular technical field resides in the provision of effective means for damping the occurrence of transient voltages within electrical and/or electronic elements mounted on and/or connected to the circuit board when a voltage is applied to these elements or components, and also to realize the significance of utilizing at least one of the sides or edges of the circuit board, namely that edge which is guided in a guide groove in the magazine to enable the circuit board to be discharged and a voltage to be applied slowly thereto with the aid of said sides, with the applied voltage increasing in dependence on the instantaneous position of the circuit board in the magazine.

It will also be seen that a technical problem resides in the advantages that are afforded when the aforesaid effective means includes at least one magazine groove or channel which receives a current supply rail intended for normalized voltage application, and at least one board edge-part which can coact with the groove or channel and which is provided with an edge strip-part which will coact with the current supply rail for direct supply of normalized voltage to the electric and/or electronic components on the circuit board, said contact strip-part being preceded by a further contact strip-part which is able to coact with the rail, as seen in the insertion direction.

It will also be seen that a further technical problem is one of realizing the advantages that are afforded when the aforesaid two contact strip-parts are electrically connected together via particularly selected and dimensioned coupling means, so as to be able to apply initially to the circuit board a voltage which lies beneath the normalized voltage, so as to dampen occurrent transient voltages with said board components.

It will also be seen that a technical problem resides in realizing that a sufficiently reliable and inexpensive coupling means? can be obtained with a resistance.

Still another technical problem resides in realizing the significance of providing each magazine-carried groove or channel, formed within a first plane, with two opposing rail-like contact surfaces for requisite voltage supply with a normalized d.c. voltage.

It will also be seen that a technical problem resides in realizing the significance of providing each magazine-carried groove or channel within a second plane placed opposite to the first plane with a rail or contact strip which is connected to earth potential and which includes a contact surface, and by providing one or all circuit boards with a contact strip or a contact device for electrical coaction with said contact surface.

It will also be seen that a technical problem resides in realizing the significance of giving a contact strip on the printed circuit boards the form of a-foil sheet fastened onto and along the edge-part of the circuit board.

Another technical problem is one of readily evaluating the best voltage increasing rate for limiting the transient voltages, and of realizing the advantage of increasing the voltage supply step-wise, in two steps, and adapting the voltage level of the first step to relevant circuits and components on the circuit board.

It will also be seen that another technical problem is one of realizing the simplifications that are afforded when the upper and lower contact devices in the form of contact strips provided on a printed circuit board for electrical coaction with magazine-carried contact surfaces are so arranged and so dimensioned that one contact strip will be brought first into coaction with the earth-potential contact surface so as to drain any static electricity on the board, and then, after moving the circuit board slightly, an initial voltage will be applied to the circuit board through the medium of a series resistance, so as to enable a voltage to be applied with a normalized supply voltage after moving the circuit board further in the magazine.

It will also be seen that a technical problem is one of realizing that an arrangement which has been successful in solving one or more of the aforesaid technical problems is also adapted in a manner which will provide conditions for a separate voltage supply at different voltage levels.

Another technical problem is one of realizing that the different voltage levels selected can be applied selectively in similar or different sequences, with the aid of simple means.

It will also be seen that a technical problem is one of realizing that a chosen distance between the end-surface of a contact strip and the end-part of a circuit board will be able to adapt a selected time position at which respective voltage steps are activated, wherein the length is chosen so as to adapt the duration of the time section of respective voltage steps.

SOLUTION

The present invention takes as its starting point an arrangement of the kind defined in the introduction, with the intention of solving one or more of the aforesaid technical problems.

According to the invention, the arrangement includes means for damping occurrent transient voltages, and further includes a current supply rail or contact strip which is received in a magazine-carried groove or channel and intended for the application of a normalized voltage, wherein at least one circuit board is provided adjacent an edge-part thereof with the groove or channel with a contact strip-part which coacts with the current supply rail and which is intended for direct voltage supply to the electric and/or electronic components on the circuit boards.

More specifically, in accordance with the present invention, when seen in the insertion direction, the contact strip-part is preceded by an additional contact strip-part which is able to coact with the rail or the contact strip, wherein the two contact strip-parts are mutually connected by a connecting device so as to supply board-carried components initially with a voltage level that lies beneath a normalized supply voltage level, this selected voltage level being adapted to dampen otherwise occurring transient voltages within said components and within the remainder of the board.

According to proposed embodiments that lie within the scope of the present invention, the connecting device has the form of a resistance, preferably a high-ohmic resistance, adapted to the board components, among other things.

It is also suggested that each magazine-carried groove or channel will be provided within a first plane with two mutually opposing rail-like contact surfaces for voltage supply with a normalized voltage.

It is also proposed that each magazine-carried groove or channel is provided within a second plane opposite the first plane with a contact surface or a contact strip which is connected to earth potential, and that a circuit board is provided with a contact surface, a contact strip or contact means for electrical coaction with the contact strip.

In this case, the contact strip may have the form of a foil strip attached along the edge-part or opposing edge-parts of the board.

When using two voltage levels, it is proposed particularly that a first voltage level occurring initially on the components is adapted to a level which is in relation to applicable circuits and components on the circuit board.

According to one embodiment, a card-mounted contact strip intended for coaction with earth potential is arranged to come into electrical contact with an earth connection before the magazine-mounted current-supplying contact strip comes into contact with a board-mounted contact strip to which voltage has been applied.

The invention also provides the possibility of creating conditions for separate voltage supply at different voltage levels in a simple manner. This can be achieved by arranging parallel rails in a magazine-mounted groove or channel and providing the board-mounted contact surface or contact strips in the form of parallel foil strips or contact devices, wherein the rails and the foil strips can be placed advantageously on one edge of the rail and on one surface of the circuit board.

The invention also affords the possibility of allowing the lengths and/or the positions of the rails in the magazine-mounted groove or channel, and the length and the position of the board-mounted contact strip or strips to be so coordinated that different selected current levels can be applied in the same or different ordered sequences.

According to another embodiment, the end-surface of a board-mounted contact strip is located along the edge-surface of the board at a position which in concert with the speed at which the board is inserted into the magazine, establishes the time at which each of the voltage steps shall be activated, wherein the length of the contact strip is adapted to determine the time duration of respective voltage step time-sections.

ADVANTAGES

Those advantages that are primarily afforded by an inventive arrangement reside in the provision of simple conditions which will enable a circuit board to be drained of static electricity in an effective manner, and in the provision of simple means for damping transient voltages that occur within board-mounted and/or board-connected electric and/or electronic components when voltage is applied initially thereto.

The inventive arrangement also enables voltage to be applied to the board-mounted component from different voltage levels, and to choose an ordered sequence, time position and/or time duration for selected sub-voltages and voltage steps.

The primary characteristic features of a magazine arrangement according to the present invention are set forth in the appended claims.

BRIEF DESCRIPTION OF THE DRAWING

An exemplifying embodiment of a magazine arrangement which includes means for damping transient voltages occurring within electric and/or electronic components mounted on and/or connected to a printed circuit board when a normalized voltage is applied initially to said components, will now be described with reference to the accompanying drawing, in which.

DESCRIPTION OF AN EXEMPLIFYING EMBODIMENT AT PRESENT PREFERRED

Figure 1:
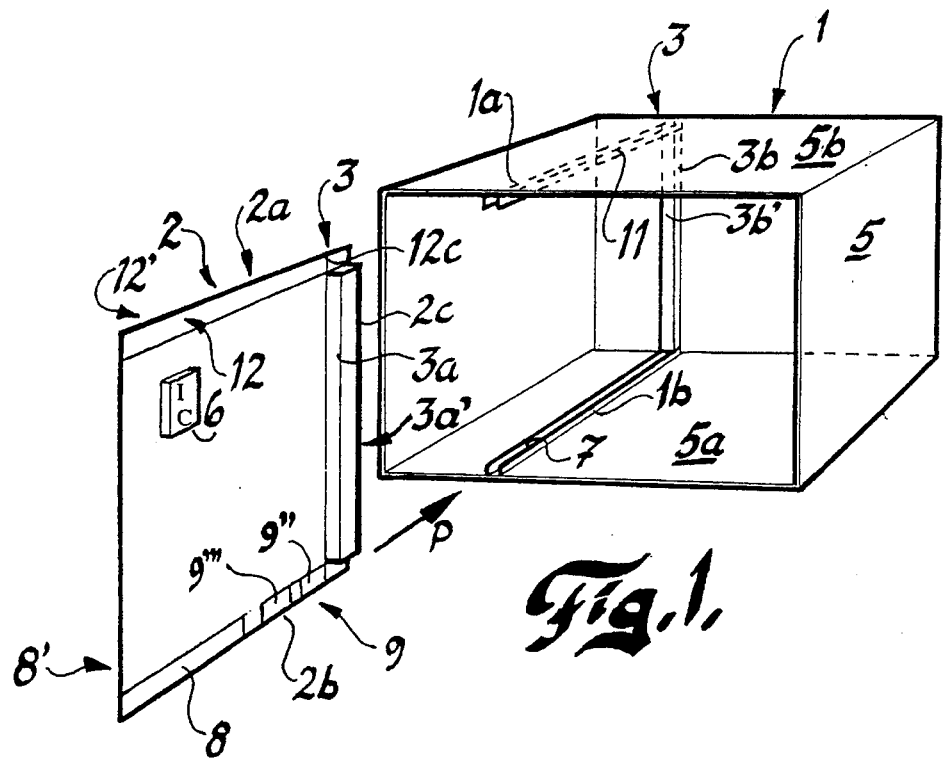
FIG. 1 is a schematic, perspective view of a magazine in which a printed circuit board with board-mounted components is shown in a position for insertion into the magazine.
Figure 2:
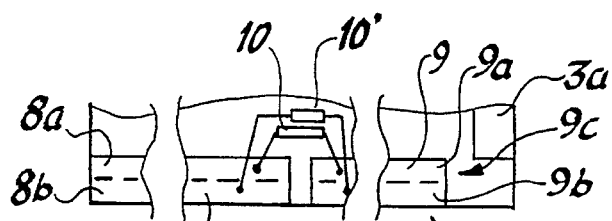
FIG. 2 is a view from above of the bottom part of the circuit board and illustrates the positioning of voltage-supplied contact surfaces on one surface or side of the board.

FIG. 1 illustrates a magazine arrangement, generally referenced 1, which is constructed to enable one or more printed circuit boards carrying electric components, electronic components and other components to be held firmly in the apparatus but readily removable therefrom.

The magazine will normally accommodate a plurality of circuit boards in side-by-side relationship, although for the sake of clarity only one circuit board is shown in FIG. 1, this board being shown in a position for insertion into the magazine 1.

Each board 2 can be inserted into and withdrawn from the magazine through the engagement of the top edge-parts 2a and the bottom edge-parts 2b of each board 2 engaging with a corresponding top groove or channel 1a and a corresponding bottom groove or channel 1b in the top plane 5b and the bottom plane 5a of the magazine 1.

The front edge 2c of the board 2 facing in towards the magazine interior carries one part 3a of a connecting element or connecting unit 3 which is adapted for coaction with a second part 3b of said connecting element on the backplane 5 of the magazine 1.

The two connecting element-parts 3a, 3b are each provided in a known manner with corresponding connecting devices 3a', 3b' which as a result of movement of the board in a direction (P) can be brought into coaction with one another, or disengaged when the board is moved in the opposite direction.

The invention is based on the provision of means between the board 2 and the magazine 1 which functions to dampen transient voltages that occur within the board-mounted and/or board-connected electrical and/or electronic components, illustrated for the sake of clarity solely in the form of an integrated circuit 6, when a normalized voltage is applied initially to the components.

According to the invention, the transient-voltage dampening means includes a current-supply rail or contact strip intended for voltage application and disposed in at least one magazine-mounted groove or channel, wherein one such contact strip 7 is shown in the bottom groove 1b.

At least one of the edge-parts of the circuit board 2 is provided adjacent the edge-part 2b that coacts with the groove 1b with a contact strip-part 8 which functions to supply voltage directly to the board-mounted electric and/or electronic components 6 and which coacts with the contact strip or rail 7. As seen in the insertion direction P, the contact-strip part 8 is preceded by a further contact strip-part 9 which can coact with the rail or the contact strips.

The aforesaid two contact strip-parts 8 and 9 are connected together electrically by a specific connecting means 10, such as to enable the circuit board 2 to be initially supplied with a voltage and/or a voltage level, via the strip-part 8, adapted for dampening transient voltages that occur primarily within the components 6.

In the case of the illustrated embodiment, the connecting device 10 is in the form of a resistance which mutually joins the contact strip-parts 8 and 9.

It will also be seen from FIG. 1 that each magazine-mounted groove 1b is provided within a first plane 5a with two mutually opposed rail-like contact surfaces 7, 7' for voltage supply, wherein the contact surface 7 forms one pole and the contact surface 7' forms another pole for the supply of a normalized d.c. voltage.

Figure 3:
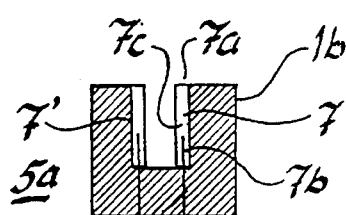
FIG. 3 is a sectional view of a groove or channel in the lower plane of the magazine.
Figure 4:
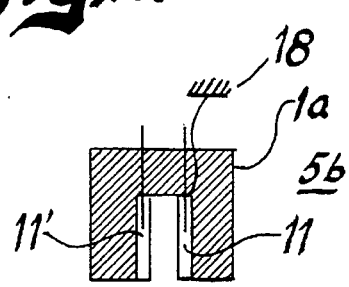
FIG. 4 is a sectional view of a groove or channel in the upper plane of the magazine.

As shown in FIG. 4, each magazine-mounted groove 1a is provided within a second plane 5b, opposite the first plane 5a, with a contact surface 11 which is connected to earth potential 18 and which is of principly the same construction as that shown in FIG. 3. It will also be seen that a circuit board 2 is provided with a contact strip or contact device 12 for electrical coaction with the contact surface 11. The groove or channel 1a may have two mutually opposing contact surfaces 11, 11' preferably sprung or resilient surfaces In the illustrated case, the contact strip 12 and the contact strips 8 and 9 have the form of foil fixedly attached to one of the edge-parts of the board, preferably along said edge-part.

When the resistance 10 is suitably dimensioned, the illustrated arrangement enables the voltage that occurs initially on the components 6 to be adapted to a level which takes into account the type of component concerned and its activation on the circuit board.

Also shown is a board-mounted contact strip which is intended for coaction with the contact surface 11, this contact strip 12 being positioned on the edge of the board so as to come into electrical contact with earth potential before the current-supplying contact strip 7, 7' comes into contact with the current-carrying contact strip 9, which therewith supplies voltage to the contact strip 8 over the resistance 10. Voltage can now be supplied to the board-mounted components 6 via the contact strip 8 or also via contact devices 3a', 3b' in a known manner.

The invention affords several different possibilities.

Firstly, different normalized voltages can be used.

In the illustrated case, the rail 11 is connected to earth potential, the rail 7' is connected to negative potential, the rail 7 is connected to normalized supply voltage, and the rail 11' is connected to another normalized supply voltage.

If more normalized supply-voltage levels are required, the rail or contact surface 7 and 11' may be divided into two, three or more parts, wherein a two-part surface 7 will have an upper part 7a and a lower part 7b which are separated by an isolating layer 7c.

Naturally, the edge-parts of the circuit board must then be provided with parallel contact surfaces formed in a corresponding manner.

Thus, contact strips 12 will coact with the contact surface 11, a contact strip 12' will coact with the contact surface 11' the contact strips 8, 9 will contact with the contact surface 7, and contact strips 8' and 9' will coact with the contact surface 7'.

If the contact surface 7 is divided in the manner illustrated, the contact strips 8 and 9 will, of course, be divided in the same way, so as to present an upper part 8a, 9a and a lower part 8b, 9b, each having a respective resistance 10, 10'.

It will be evident that the contact strip 9 can be divided into a number of sub-parts 9' and 9" so as to provide conditions for a voltage increase in several steps or stages.

It will be observed that with a specific board-insertion speed the lengths of respective parts will determine the time period over which a relevant reduced voltage is active.

It will also be observed that the position of the end-surface 9c of respective contact strips will determine the time positions at which the voltage step is activated.

In FIG. 1, the end-surface 12c of the contact strip 12 is located in front of the end-surface 9c.

Thus, the time at which one or more voltage steps is/are activated can be chosen for each selected normalized voltage level, and the duration of each step can be determined.

It can be mentioned in general that in the case of the direct normalized voltage supply, the contact strip 8 or the like will preferably be made short, normally shorter than the length shown in the Figure.

It will be noted that generated transient voltages will not only influence the applied circuit board but also other circuit boards that have already been fitted.

It will be understood that the invention is not restricted to the aforedescribed exemplifying embodiment thereof and that modifications can be made within the scope of the inventive concept as defined in the following claims.

I claim:

1. A magazine arrangement for one or more removable circuit boards, each board including a first connecting element and upper and lower edge, at least one of the edges having a first contact strip and a second contact strip, for supplying voltages to any components connected to the circuit board, the arrangement comprising:

upper and lower grooves which coact with the upper and lower edges of the circuit boards;

a contact rail located in at least one of the grooves for coacting with the first and second contact strips on the circuit board thereby applying a voltage to the board;

a second connecting element located on a backplane of the magazine for connecting with the first connecting element of the circuit board;

means for damping transient voltages that occur within one or more board mounted or connected components when a voltage is applied to the components, wherein, when viewed in the direction of circuit board insertion into the magazine, the second contact strip precedes the first contact strip, connected by a circuit board related connecting means, to enable the board to be supplied with a voltage adapted to dampen transient voltages that occur within the components.

2. A magazine arrangement (1) constructed to enable one or more printed circuit boards to be firmly held in the magazine but readily removable therefrom, wherein the circuit boards are disposed side-by-side and can be inserted into and withdrawn from the magazine by virtue of each board (2) having upper and lower edge-parts which coact with upper (1a) and lower (1b) grooves in the magazine (1), wherein each board carries on its edge (2c) that faces inwardly of the magazine one part (3a) of a connecting element (3) which is intended to be brought into and out of coaction with a second part (3b) of the connecting element (3), this latter part being located on the backplane (5) of the magazine, wherein the two parts of the connecting element (3) are each provided with a respective corresponding connecting device, wherein means are provided for damping transient voltages that occur within one or more of board-mounted and board-connected electrical and electronic components (6), when voltage is applied to said components, wherein said means includes at least one current-supply rail or contact strip (7) which is intended to be received in a magazine-mounted groove or channel (1b) and is intended for voltage application, and wherein at least one board (2) is provided adjacent an edge-part thereof (2b) that coacts with the groove or channel (1b) with a contact strip-part (8) which can coact with the rail and through which a voltage is applied directly to the board-mounted electric and/or electronic components (6), characterized in that when seen in the direction (P) of board-insertion into the magazine, the contact strip-part (8) is preceded by a further contact strip-part (9) which can coact with the rail or the contact strip, wherein the two contact strip-parts (8, 9) are connected electrically together by circuit-board related connecting means (10), so as to enable the board to be supplied with a voltage adapted to dampen transient voltages that occur within said components (6).

3. An arrangement according to claim 2, characterized in that the connecting means is a circuit-board related resistance (10).

4. An arrangement according to claim 2, characterized in that each magazine-carried lower groove or channel (1b) is provided within a first plane (5a) with two mutually opposed rail-forming voltage-supply contact surfaces (7, 7').

5. An arrangement according to claim 2, characterized in that each magazine-carried lower groove or channel (1a) is provided within a second plane (5b) opposite the first plane (5a) with a contact surface (11) which is connected to earth potential; and in that a circuit board includes a contact strip or contact device (12) for electrical coaction with said contact surface.

6. An arrangement according to claim 2, characterized in that the contact strip is in the form of a foil strip attached to and along the edge-part of the board.

7. An arrangement according to claim 2, characterized in that the connecting device functions to adjust a voltage initially supplied to the board-mounted component to a level which is related to the relevant circuits and components on the circuit board.

8. An arrangement according to claim 2, characterized in that a separate voltage supply is effected at different voltage levels through the medium of parallel rails in a magazine-carried groove or channel.

9. An arrangement according to claim 8, characterized in that parallel rails are orientated to one edge of the rail.

10. An arrangement according to claim 2, characterized in that the lengths of the rails and/or position of the rails in the magazine-carried groove and the board-carried contact strip or strips are coordinated to enable selected different voltage levels to be activated in the same or different ordered sequence.

11. An arrangement according to claim 2, characterized in that the end-surface of respective board-carried contact strips is adapted to establish, together with the speed at which the board is inserted, the time for activating each of the voltage steps, and the lengths of respective contact strips are adapted to establish the time duration of the time section of respective voltage steps.

12. An arrangement according to claim 3, characterized in that each magazine-carried lower groove or channel (1b) is provided within a first plane (5a) with two mutually opposed rail-forming voltage supply contact surfaces (7, 7').

13. An arrangement according to claim 3, characterized in that each magazine-carried upper groove or channel (1a) is provided within a second plane (5b) opposite the first plane (5a) with a contact surface (11) which is connected to earth potential; and in that a circuit board includes a contact strip or contact device (12) for electrical coaction with said contact surface.

14. An arrangement according to claim 4, characterized in that each magazine-carried upper groove or channel (1a) is provided within a second plane (5b) opposite the first plane (5a) with a contact surface (11) which is connected to earth potential; and in that a circuit board includes a contact strip or contact device (12) for electrical coaction with said contact surface.

15. An arrangement according to claim 5, characterized in that each magazine-carried upper groove or channel (1a) is provided within a second plane (5b) opposite the first plane (5a) with a contact surface (11) which is connected to earth potential; and in that a circuit board includes a contact strip or contact device (12) for electrical coaction with said contact surface.

16. An arrangement according to claim 8, characterized in that the lengths of the rails and/or position of the rails in the magazine-carried groove and the board-carried contact strip or strips are coordinated to enable selected different voltage levels to be activated in the same or different ordered sequence.

* * * * *